United States Patent [19]

Coleman, Jr.

[11] 4,052,740
[45] Oct. 4, 1977

[54] MOIRE INTERFERENCE REDUCING CIRCUIT FOR FM VIDEO RECORDERS

[75] Inventor: Charles Hubert Coleman, Jr., Belmont, Calif.

[73] Assignee: Ampex Corporation, Redwood City, Calif.

[21] Appl. No.: 668,379

[22] Filed: Mar. 19, 1976

[51] Int. Cl.² ............................................... G11B 5/02
[52] U.S. Cl. .......................................... 360/30; 358/8
[58] Field of Search ............................ 360/30, 24, 33; 178/DIG. 12; 358/8

[56] References Cited

U.S. PATENT DOCUMENTS

| 3,084,224 | 4/1963 | Sanford | 360/30 |
| 3,893,168 | 7/1975 | Bechly et al. | 360/30 |

Primary Examiner—Vincent P. Canney
Attorney, Agent, or Firm—Robert G. Clay; Ralph L. Mossino

[57] ABSTRACT

A method and apparatus for suppressing spurious interference components that arise in video recording apparatus of the type which utilize frequency modulation of the carrier signal with a video signal is disclosed. The invention suppresses an unwanted spurious interference signal component substantially to zero by generating the second harmonic of a fundamental signal in the video information modulating signal and adding the second harmonic to the fundamental modulating signal at a predetermined phase and amplitude prior to being modulated upon the carrier signal. The phase is such that the resulting signal is that which, when the second harmonic is added, heightens the upward deviating peaks and flattens the lower peaks of the fundamental modulating signal. The amplitude of the added second harmonic is such as to minimize the interference component and is varied signal in direct proportion to the square of any variation in the modulating index of the fundamental modulating signal.

18 Claims, 4 Drawing Figures

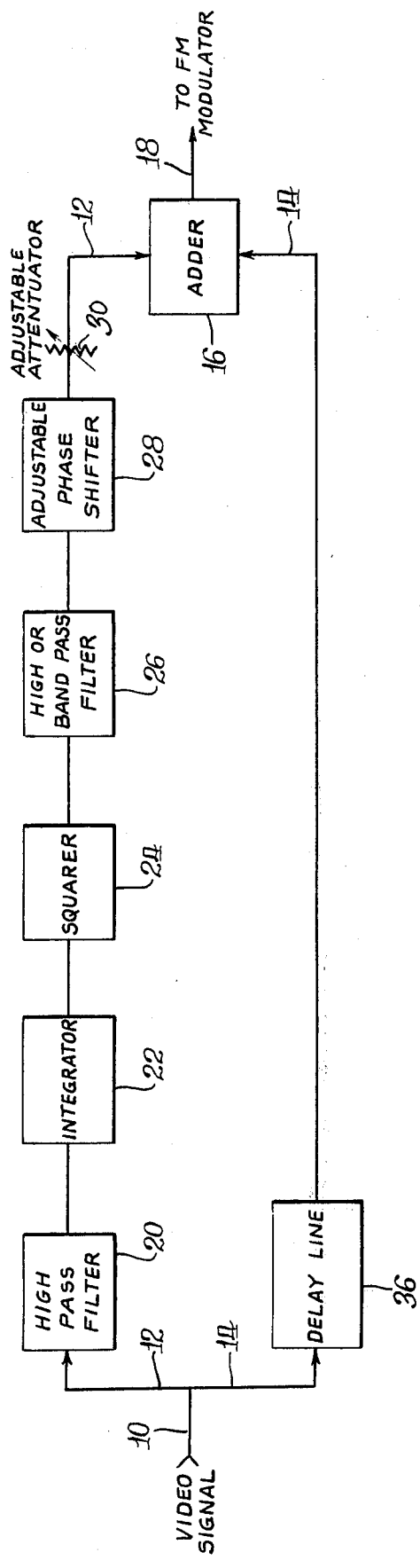
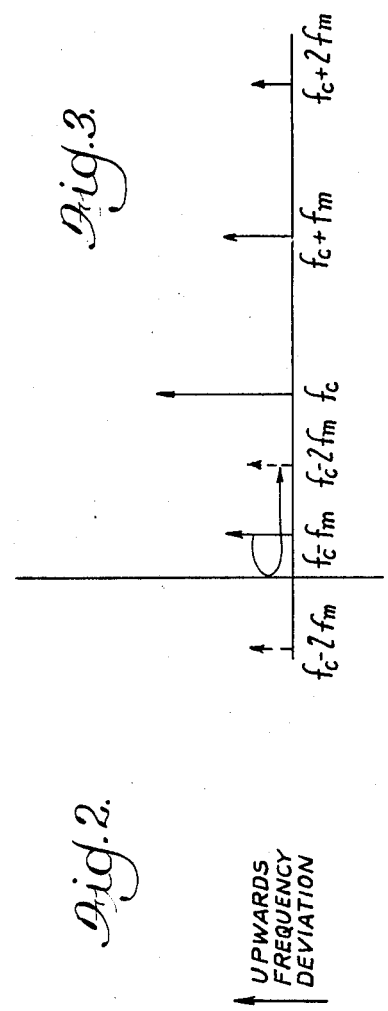
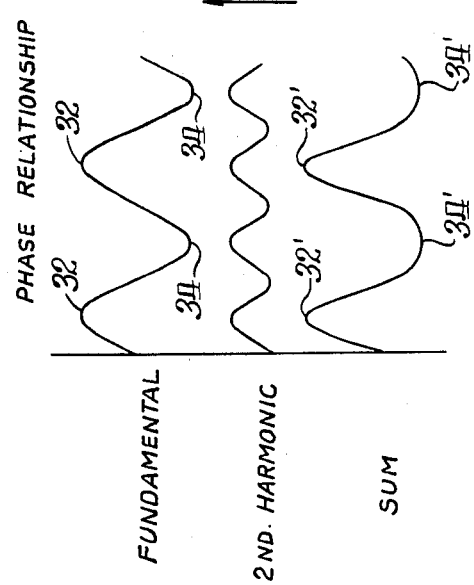

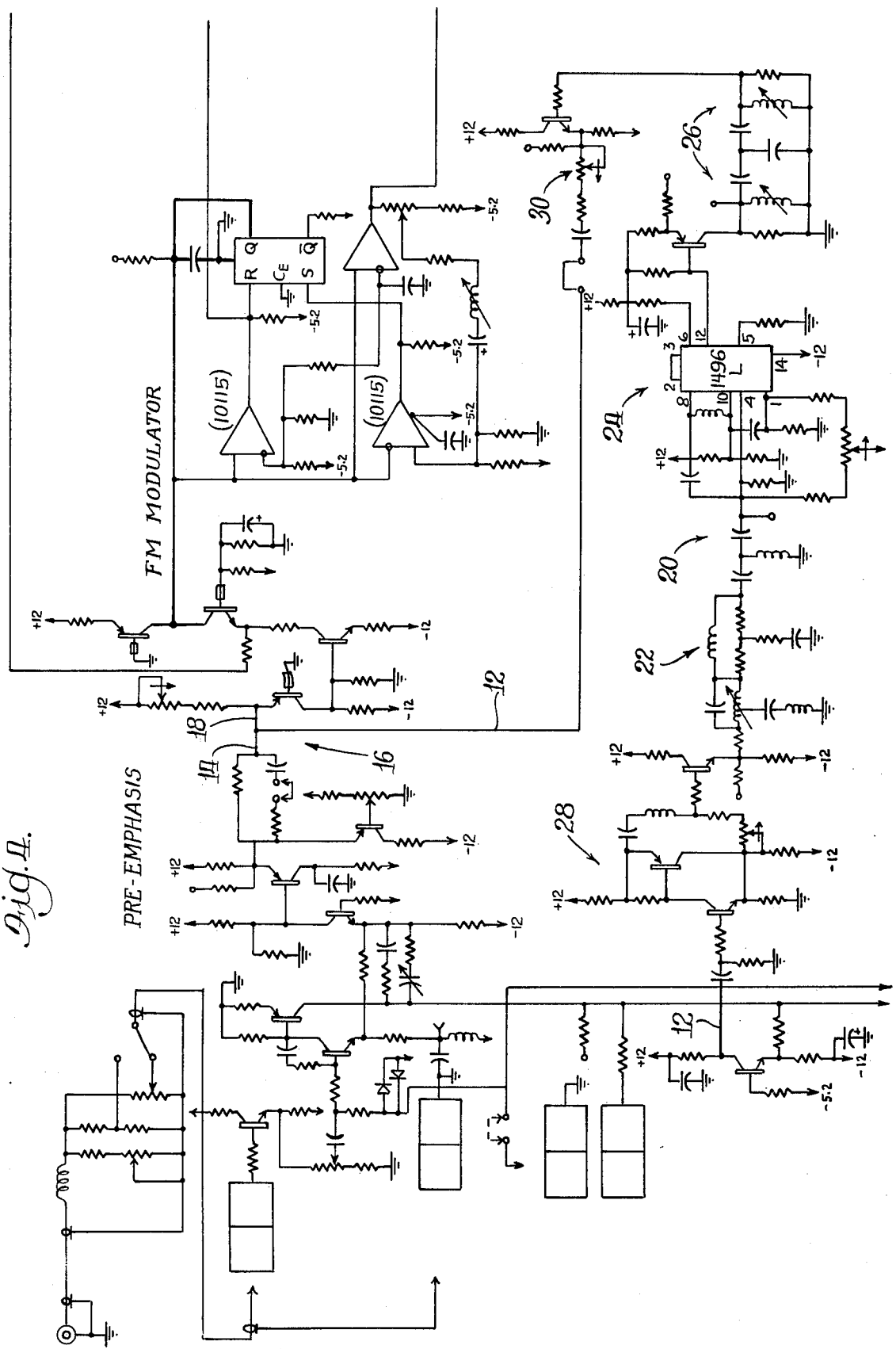

MOIRE INTERFERENCE REDUCING CIRCUIT FOR FM VIDEO RECORDERS

The present invention generally relates to frequency modulation and, more specifically, to reducing moire interference in frequency modulated video signal systems.

The recording of television signals on magnetic tape or the like is frequently accomplished by using frequency modulation, i.e., the video information signal is frequency modulated upon a carrier signal and the resulting signal is recorded on the magnetic tape. In the modulated carrier signal, the video information is contained in the timing of axis crossings and, when recorded on tape, is contained in the locations of changes in magnetic state. The composite color video information signal includes a luminance signal as well as a chrominance or color subcarrier signal which is the color information amplitude modulated on a subcarrier frequency of about 3.58 MHz in the United States and about 4.43 MHz for the PAL and SECAM standards which are used in many European countries. Because of the use of a carrier frequency in the frequency modulation process that is not sufficiently high in relation to the higher frequencies of the modulating signal, various problems are encountered in recording such signals. Moreover, the saturation characteristics of the magnetic recording medium, i.e., the magnetic tape, results in inherent limiting of the signal. As a result of the frequency modulation process and the relative frequencies of the modulating signal and the carrier, certain sidebands produced by the modulated signal, (i.e., the color subcarrier ) for example, the second and third order lower sidebands produced thereby, may extend down and through zero frequency into the negative frequencies and "fold over" into the vicinity of the frequency modulated carrier so as to be within the video bandwidth (see FIG. 3) of the demodulated signal. These folded over sidebands as well as lower sidebands of odd harmonics of the carrier frequency produce demodulated spurious interference signals which are also referred to as moire interference. Moire interference usually produces noticeable distortion of the television picture during playback of the videotape.

In the past, the most common and successful technique that has been employed to minimize moire distortion effects has involved the careful selection of the carrier frequency, the amount of luminance deviation, the modulating index of the chrominance subcarrier and the appropriate adjustment of the reproduce electronics in the recording equipment. The maximum amount of FM deviation at the subcarrier frequencies that can be used in color video recording is limited by the permissible level of demodulated spurious frequency components (moire) that result from the presence of folded or negative frequency sidebands, as well as similar sidebands, in the FM spectrum. The restriction on the FM deviation has limited the signal to noise ratio that has been achievable and, in recording on magnetic tape, ultimately has determined the amount of tape required for a given level of system performance.

Accordingly, it is an object of the present invention to provide a method and apparatus for suppressing or substantially reducing the demodulated spurious interference components, such as moire, thereby allowing for either increased FM deviation or improved performance with respect to such spurious signals or a combination of both.

Other objects and advantages will become apparent upon reading the following detailed description, while referring to the attached drawings, in which:

FIG. 1 is a schematic block diagram of apparatus embodying the present invention;

FIG. 2 is a graph of various waveforms relating to the present invention;

FIG. 3 is a diagram of frequency components illustrating negative or folded over sidebands in frequency modulation; and, FIG. 4 is an electrical schematic diagram of circuitry generally corresponding to the block diagram of FIG. 1 and embodying the present invention.

Broadly stated, the present invention is directed to a method as well as circuitry for reducing or suppressing spurious or moire producing interference components in the demodulated output from a video system that employs frequency modulation. Moreover, while the circuit may be adjusted to reduce a specific order spurious component, adjacent orders of spurious components are also suppressed to a lesser degree. An important feature of the invention is its capability of reducing such spurious components to virtually zero. The invention suppresses the spurious components by adding an even harmonic distortion to the original or fundamental modulating signal in such a phase and amplitude that the spurious components are suppressed in the modulation process. Stated in other words, the second harmonic signal of the fundamental modulating frequency signal is added to the fundamental modulating frequency signal prior to or during the frequency modulation of the carrier, with the second harmonic being added with respect to the fundamental modulating frequency signal in such a phase and amplitude relationship whereby a specific moire interference component can be suppressed to virtually zero.

In accordance with an important aspect of the present invention, the phase relationship of the second harmonic of the fundamental modulating fequency is added in such a manner that the waveform of the fundamental modulating signal has the upper peaks heightened and the lower peaks flattened or compressed as a result of the addition of the second harmonic signal to it. When the phase relationship is adjusted so that the above intentional distortion occurs in the fundamental modulating signal waveform, the demodulated moire producing spurious components will be reduced to virtually zero, provided that the amplitude of the second harmonic signal is properly determined.

The required amplitude of the second harmonic signal is a function of the modulation index generally as well as the particular order of the spurious component to be suppressed. For example, for a given modulation index $\beta$, a fourth order demodulated spurious component defined as one being due to the folded fourth sideband and lower fourth sidebands of the third harmonic of the carrier frequency, would require a lower amplitude of added second harmonic than would a correspondingly defined third order spurious component. More specifically, the required amplitude is directly proportional to the square of the modulating index $\beta$, wherein the modulating index is considered to be the ratio of the peak frequency deviation of the carrier frequency to the modulating signal frequency itself. Thus, if the fundamental modulating signal experiences an increase in level of 1 DB, for example, then the required amplitude for the added second harmonic should vary as the square of the 1 DB increase and would accordingly require an increase in amplitude of 2 DB. Similarly, an increase of 2 DB in the fundamental modulating frequency level would require a second harmonic signal having a 4 DB increased level.

Turning now to the drawings and particularly FIG. 1, there is shown a block diagram of apparatus embodying the present invention that is useful in suppressing the spurious interference components that often arise in the demodulated output of video recording apparatus of the type in which a carrier signal is frequency modulated by the composite color video signal. As shown in the drawing, a composite color video signal which comprises the full video spectrum is applied to an input 10 where it is separated into two paths; an upper path 12 and lower path 14. The separated video signals are eventually combined in an adder 16 having an output 18 extending to an FM modulator. Prior to being recorded on magnetic tape, the combined video signal frequency modulates the carrier signal at the FM modulator.

The upper path 12 includes a high pass filter 20 which is of conventional design and peferably passes only the upper half of the video spectrum, including the color subcarrier and its sidebands and it preferably rejects the lower half. The output of the high pass filter 20 is applied to an integrator 22 which has a falling 6 DB per octave frequency response to compensate for the dependence of $\beta$ on the modulating frequency. In this regard, the modulating index $\beta$ is generally defined as the ratio of the peak frequency deviation of the carrier frequency to the modulating frequency itself. The integrator 22 is of conventional design and may be a constant impedence network or the like. The integrator is included to attempt to have, at least over the bandwidth occupied by the total chrominance band (lying in the vicinity of the subcarrier frequency), a relationship that would be correct for all frequency components in that vicinity so that the attenuator and phase shifter settings (described hereinafter) would be simultaneously correct for all such frequencies once they were optimized. In this regard, the integrator is not indispensable from a practical standpoint and satisfactory results may be obtained without it, although its inclusion is preferred.

The output of the integrator is thereafter applied to a squarer 24 which generates the second harmonic frequency signal from the fundamental modulating frequency signal, i.e., the color subcarrier which is that signal in the upper half of the video spectrum. The squarer is also a conventional design and may comprise a conventional multiplier circuit in which the signal is multiplied by itself or it may utilize the voltage versus current characteristic of a diode or transistor junction, for example. The output of the squarer is the second harmonic of the input signal to it (i.e., the color subcarrier) and also has an amplitude that varies as the square of the amplitude that is applied at its input. The output of the squarer is applied to either a band pass filter or high pass filter 26 which is utilized to remove any unwanted frequency components from the output of the squarer 24. The band pass filter 26 is of conventional design and may be, for example, a coupled resonator type having a wide band response that is centered upon the second harmonic frequency of the color subcarrier. The signal from the filter 26 is then applied to an adjustable phase shifter 28 which adjusts the second harmonic signal phase to have the relationship to the fundamental modulating frequency or color subcarrier signal which, when the second harmonic is added to the fundamental or color subcarrier, is as has been described and which is shown in the waveforms of FIG. 2. The upper path 12 further includes an attenuator 30 which can be adjusted to produce virtual cancellation of the specific spurious frequency component and would have a different setting for each order of component that is to be cancelled. Generally speaking, the adjacent order components will aslo be reduced, but not completely cancelled, when the attenuator 30 is properly adjusted to completely cancel one component. Thus, for example, if the attenuator is adjusted to cancel the third order components, the second and fourth order components would also be reduced or suppressed, but to a lesser degree.

In accordance with an important aspect of the present invention and referring to the phase relationship waveforms shown in FIG. 2, a fundamental modulating color subcarrier frequency is illustrated which could be applied to the input 10 and is shown to have upper peaks 32 as well as lower peaks 34. The circuitry in the upper path 12 of FIG. 1 is adapted to produce a second harmonic of the modulating or color subcarrier frequency which is shown in FIG. 2. The phase shifter 28 is adjusted so that when the fundamental and second harmonics are added together, the sum shown in the bottom waveform in FIG. 2 will be such that the upper peaks 32' are shown to be heightened (or stretched) in the direction of the upper frequency deviation of the carrier and the lower peaks 34' are shown to be compressed. When the phase relationship of the second harmonic of the color subcarrier applied from the upper path 12 to the adder 16 is in the relationship shown in FIG. 2 relative to the fundamental modulating or color subcarrier frequency applied to the adder 16 from the lower path 14, the combined or summed signal on line 18 will be of such a form that, when applied to an FM modulator, the eventual demodulating of that FM signal by conventional means will result in having the spurious interference component suppressed so that it will not appear in the demodulated output.

It should also be appreciated that the circuit components in the upper path 12 include the filters 20 and 26 which may produce a delay which is not present in the lower path 14. Accordingly, a delay line 36 may be provided to insure that the signals in both paths reach the adder 16 at the same time. In practice, the delay line 36 may not be required for the reason that the results may be adequate in some applications without its use.

The circuitry of FIG. 1 represents merely one block diagram of components tht may be used to practice the method of the present invention. The particular order of the blocks is not particularly critical in most instances and, referring to the electrical schematic diagram of FIG. 4, it is seen that the specific circuitry which also embodies the present invention has a somewhat different order of occurrence than the block diagram of FIG. 1. More specifically, the phase shifter 28 is located at the input side rather than near the adder 16 and operates at the fundamental or color subcarrier frequency, rather than the second harmonic, and the integrator 22 integrates the modulating or color subcarrier signal before it is applied to the high pass filter 20. However, the band pass filter 26 occurs subsequently of the squarer 24 for the reason that it is intended to filter out the unwanted components that are present as a result of the squaring process. It should also be appreciated that the delay line 36 is not present in the circuitry of FIG. 4 for the reason that the delay generated in the path 12 is only about 300 nanoseconds which is approximately equal to 1 full cycle of a 3.58 MHz signal and this amount of delay is viewed as being acceptable, provided the phase and amplitude requirements previously discussed are met.

The FM signal produced by modulating an FM modulator in the above manner has its zero crossing locations deliberately altered and this signal should be handled throughout the record-playback process in a manner whereby the altered zero crossings are not further altered in their relative positions to one another, provided that it is desired that the spurious component remains at its previously adjusted level of suppression. This means that all frequency and time responses involved in the FM path should be properly designed to avoid inter-symbol interference within the signal. If inter-symbol interference exists within the record-playback process, it is possible to properly adjust the phase and amplitude adjustments 28 and 30 respectively so that a compensating effect is accomplished and the finally demodulated signal will have the desired level of suppression. The FM signal after it is recovered from videotape is preferably eventually applied to a pulse counter type of FM demodulator (not shown) containing the usual low pass filter in its output which rejects all frequencies above the normal video band including the added second harmonic of the modulating color subcarrier frequency signal.

The amount of increase in FM deviation permitted by practicing the method of the present invention depends upon several factors. Generally, it is most useful in the situations wherein the carrier deviation at subcarrier modulating frequencies has been held down due to low order spurious interference. As an example, the deviation standard for the PAL 625 high band which has a color subcarrier frequency of 4.43 MHz is restricted by third order components to a modulation index $\beta$ of about 0.4 for standard test conditions. By using the method of the present invention, it would be possible to have an increase of some 8 DB to a modulation index $\beta$ of about 1.0. However, in practice, the full increase may not be useable because of peak wavelength considerations of the magnetic tape.

From the foregoing description it should be understood that a method and apparatus has been illustrated and described which is effective for suppressing spurious interference components, also referred to as moire interference components, that may otherwise appear in the demodulated output from playback of a recorded tape, and that result from the frequency modulation of a carrier. The present invention processes the modulating frequency signal in a manner whereby when eventually demodulted a particular component will be virtually eliminated. The method and apparatus of the present invention does not rely upon the imperfections of the recording playback system to compensate for moire producing interference effects and may be used without introducing any other significant distortion in the recording and playback process.

It is of course understood that although preferred embodiments of the present invention have been illustrated and described, various modifications, alternatives and equivalents thereof will become apparent to those skilled in the art and, accordingly, the scope of the present invention should be defined only by the appended claims and equivalents thereof.

Various features of the invention are set forth in the following claims.

What is claimed is:

1. A method of reducing a spurious interference component in a demodulated signal of a frequency modulated signal transmission system wherein a modulating signal having a fundamental frequency modulates a carrier signal, the spurious interference component being caused by interaction between the fundamental frequency and the carrier signal, comprising the steps of:
    adding a second harmonic frequency of said modulating signal in a predetermined phase and amplitude to said fundamental modulating signal prior to frequency modulating said carrier signal; and,
    thereafter frequency modulating said carrier signal with said modulating signal having its second harmonic frequency added thereto at said predetermined phase and amplitude, the phase and amplitude of the second harmonic frequency being such that the interference component in the demodulated signal is reduced.

2. A method of a defined in claim 1 wherein said predetermined phase is such that the waveform of the modulating signal has the peak producing upward frequency deviation of the carrier signal extended and the downwardly deviating peak flattened by the addition of the second harmonic frequency.

3. A method as defined in claim 1 wherein the amplitude of the added second harmonic frequency is varied in direct proportion to the square of any variation in the modulating index of the modulating signal.

4. A method of reducing an undesirable sideband located within the demodulated output of a color videotape recording system of the type where a color video signal, having a color subcarrier, frequency modulates a carrier signal, comprising the steps of:
    adding to the color video signal the second harmonic signal of said color subcarrier prior to frequency modulating said carrier signal, said second harmonic signal being added to said color video signal at a predetermined phase and amplitude, the phase being such that the waveform of the color subcarrier has its peak portions that produce upwards carrier frequency deviation increased and the peak portions that produce downwards carrier frequency deviation flattened by the addition of said second harmonic signal; and
    frequency modulating said carrier signal with said color video signal having said added second harmonic signal.

5. A method as defined in claim 4 wherein the amplitude of said added second harmonic signal is such as to minimize the undesirable sideband in the demodulated output and is varied as the square of any variation in the ratio of the frequency deviation of said carrier signal to said color subcarrier frequency.

6. Frequency modulation apparatus for processing a modulating signal to reduce at least one order of spurious frequency components that can otherwise appear in the demodulated output of said apparatus and be generated by the interaction between the modulating signal and a carrier signal modulated by said modulating signal, comprising:
    means for generating the second harmonic frequency signal of said modulating signal;
    means for adjusting the phase of said second harmonic frequency signal for subsequent addition to said modulating signal at a predetermined phase relationship;

means for adjusting the amplitude of said second harmonic frequency signal to a predetermined amplitude;

means for combining said second harmonic frequency signal and said modulating frequency signal; and means coupled to said combining means for generating a carrier frequency modulated with said combined signals.

7. Apparatus as defined in claim 6 wherein said amplitude adjusting means is adapted to adjust the amplitude to suppress the spurious frequency component and means are provided for automatically varying the amplitude of said second harmonic frequency signal in direct proportion to the square of any variations in the modulation index of said modulating signals.

8. Apparatus as defined in claim 6 wherein the phase of said second harmonic signal is such that when it is combined with said modulating frequency signal the wave form of the combined signal has its peak portions that produce upward carrier frequency deviation increased and the peak portions that produce downward carrier frequency deviation flattened.

9. Apparatus as defined in claim 6 wherein said phase adjusting means is adapted to adjust the phase of said second harmonic frequency signal such that when it is added to the modulating signal, the phase relationship between the two signals is such that the upwards carrier frequency deviating peak portions of the modulating signal are heightened and the downward carrier frequency deviating peak portions are flattened as a result of the combining of the second harmonic frequency signal therewith.

10. Apparatus as defined in claim 6 including means for introducing a delay in the modulating signal that is to be applied to the combining means to match the delay that is introduced in the generation of the second harmonic frequency signal.

11. Apparatus for use in a color video recorder of the type wherein a color video signal frequency, having a color subcarrier, modulates a carrier signal, said apparatus being adapted to reduce at least one order spurious interference component that can otherwise appear in the demodulated color video signal during playback of a color video recording recorded on said recorder, the spurious interference component being otherwise generated by the interaction between the carrier signal and the color subcarrier, comprising:

means for processing said color video signal to generate a second harmonic signal of said color subcarrier of predetermined phase and amplitude for subsequent combining with said color video signal prior to frequency modulation of the carrier signal;

means for combining said second harmonic signal and said color video signal for modulating said carrier signal.

12. Apparatus as defined in claim 11 wherein said processing means further includes:

means for selecting the amplitude of said second harmonic signal so as to suppress the spurious interference component and means for automatically varying the amplitude of said second harmonic signal in direct proportion to the square of any variation in the modulating index of the color subcarrier.

13. Apparatus as defined in claim 12, wherein said processing means further includes:

means for adjusting the phase of second harmonic signal so that when it is combined with the color video signal, the phase is such that the resulting combined color subcarrier signal has its peak portions that produce upward carrier frequency deviation increased and the peak portions that produce downward carrier frequency deviation flattened.

14. Apparatus as defined in claim 11 wherein said processing means further includes:

means for adjusting the phase of said second harmonic signal so that when it is combined with the color video signal, the phase is such that the resulting combined color subcarrier signal has its peak portions that produce upwards carrier frequency deviation increased and the peak portions that produce downwards carrier frequency deviation flattened.

15. Apparatus as defined in claim 14 including means for delaying said color video signal, said delaying means being connected in parallel with said processing means and having a delay approximately equal to the delay introduced by said processing means, said delay means having an output connected to said combining means.

16. In a frequency modulated signal transmission system wherein a carrier signal is frequency modulated by a modulating signal including a fundamental frequency signal, a method of reducing a spurious interference component which can be caused by the interaction between the fundamental frequency signal and the carrier signal and can appear in the demodulated modulating signal provided by said system, comprising the steps of:

providing a harmonic signal having a frequency that is a harmonic of said fundamental frequency signal and having a specific phase and amplitude relationship relative to said fundamental frequency signal; and thereafter frequency modulating said carrier signal with both said modulating signal and said harmonic signal; said frequency, phase and amplitude of said harmonic signal being selected to deliberately alter the axis crossing locations of the frequency modulated carrier signal from locations that would otherwise result from modulating the carrier signal with only the fundamental frequency signal and to thereby reduce said spurious interference component contained in the demodulated modulating signal.

17. A method as defined in claim 16 wherein the modulating signal is a color video signal, the fundamental frequency is the color subcarrier in said color video signal, and the second harmonic of said color subcarrier is provided.

18. A method according to claim 17 wherein the amplitude of said second harmonic signal is such as to minimize the interference component and the phase relationship between the second harmonic and the color subcarrier is such that the upward carrier frequency deviating peak portions of the color subcarrier are increased and the downward carrier frequency deviating peak portions are flattened as a result of the combining of the second harmonic signal with the color subcarrier.

* * * * *